(12) United States Patent
Kress et al.

(10) Patent No.: US 6,717,436 B2
(45) Date of Patent: Apr. 6, 2004

(54) RECONFIGURABLE GATE ARRAY

(75) Inventors: Rainer Kress, Pöring (DE); Klaus Buchenrieder, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/112,532

(22) Filed: Mar. 28, 2002

(65) Prior Publication Data

US 2002/0125911 A1 Sep. 12, 2002

Related U.S. Application Data

(63) Continuation of application No. PCT/DE00/03349, filed on Sep. 22, 2000.

(30) Foreign Application Priority Data

Sep. 29, 1999 (DE) .......................................... 199 46 752

(51) Int. Cl.[7] .............................................. H03K 19/173
(52) U.S. Cl. .............................. 326/40; 326/38; 326/41
(58) Field of Search ...................................... 326/38–41

(56) References Cited

U.S. PATENT DOCUMENTS

| 4,870,302 A | 9/1989 | Freeman |
| 4,935,734 A | 6/1990 | Austin |
| 5,835,405 A | 11/1998 | Tsui et al. |
| 5,838,165 A * | 11/1998 | Chatter .......................... 326/38 |
| 6,438,737 B1 * | 8/2002 | Morelli et al. ................. 716/16 |

FOREIGN PATENT DOCUMENTS

| DE | 196 54 846 A1 | 7/1998 |
| DE | 198 07 872 A1 | 8/1999 |
| EP | 0 790 706 A2 | 8/1997 |
| WO | WO 99/34515 | 7/1999 |

OTHER PUBLICATIONS

Betty Prince: "Semiconductor Memories", Teubner Verlag, Stuttgart, 2nd ed., 1991, pp. 479–483.

* cited by examiner

*Primary Examiner*—Anh Tran
(74) *Attorney, Agent, or Firm*—Laurence A. Greenberg; Werner H. Stemer; Gregory L. Mayback

(57) ABSTRACT

The invention relates to an FPGA (field programmable gate array) with a plurality of functional blocks. An interface enables data and address communication between a processor and the FPGA. The gate array is provided with configurations from a configuration memory. The FPGA also includes a buffer memory for selectively storing configurations from the configuration memory and for the direct selective access, from the FPGA, to any configuration stored in the buffer memory.

3 Claims, 3 Drawing Sheets

RECONFIGURABLE GATE ARRAY

CROSS-REFERENCE TO RELATED APPLICATION

This application is a continuation of copending International Application No. PCT/DE00/03349, filed Sep. 22, 2000, which designated the United States.

BACKGROUND OF THE INVENTION

Field of the Invention

The invention relates to a reconfigurable gate array with a number of function blocks. The function blocks are connected to one another via controllable wiring and can be controlled individually, for the respective execution of a specific function. An interface for data and address communication is connected between a processor and the gate array, and to supply configurations, in each case needed to control the function blocks and/or their wiring from a configuration memory.

A reconfigurable gate array of the type is, for example, a known user-programmable gate array or FPGA (field programmable gate array). Such FPGAs are, for example, provided by a module from the XC6200 family, i.e., the XC62xx series (xx=09, 16, 36, or 64) from XILINX® or they are described in Hartenstein and Prasanna: "Reconfigurable Architectures: High Performance by Configware," Itpress Verlag, D-76607 Bruchsal, Germany, 1997 (ISBN 0-9639887-1-9), p. 147–50.

SUMMARY OF THE INVENTION

It is an object of the invention to provide a reconfigurable gate array, which overcomes the disadvantages of the heretofore-known devices and methods of this general type and which allows wider functions to be implemented than hitherto.

With the foregoing and other objects in view there is provided, in accordance with the invention, a reconfigurable gate array assembly, comprising:
- a gate array with a plurality of function blocks connected to one another via controllable wiring, the function blocks being individually controllable, for a respective execution of a specific function;
- a first interface for data and address communication between the gate array and a processor;
- a second interface for supplying configurations from a configuration memory, in each case needed to control one of the function blocks and the controllable wiring; and
- a buffer memory device connected to the second interface for selectively storing configurations from the configuration memory and for direct selective access from the gate array to any configuration stored in the buffer memory device;
- the buffer memory device having a reconfiguration controller, operating in accordance with a caching strategy, for removing little-used, unused, or last-used configurations from the buffer memory device to create space for new configurations.

In accordance with an added feature of the invention, the buffer storage device is commonly integrated with the gate array on a common semiconductor chip.

In accordance with a concomitant feature of the invention, the buffer storage device comprises at least one dual-ported memory having a first port for a selective supply of configurations from the configuration memory and for storing the configurations supplied in the double-ported memory, and a second port for allowing the gate array direct selective access to any configuration stored in the dual-ported memory.

In other words, the gate array according to the invention is characterized by a buffer memory device for the selective storage of configurations from the configuration memory and for direct selective access from the gate array to each configuration stored in the buffer memory device.

This solution advantageously provides a reconfigurable, in particular dynamically reconfigurable, integrated circuit with which, even in the case in which the number of function or logic blocks and/or the wiring resources are too small for an implementation of a wider, industrially relevant circuit and/or function, such a wider circuit and/or function can still be implemented.

Advantageously, in this solution, even functions which are represented on an FPGA used as a coprocessor and which can be found only with difficulty in the code of a program, and often can only be loaded inefficiently dynamically onto the FPGA during the running of the program, can be found significantly more easily.

In addition, dynamic displacement of functions onto an FPGA, which in the case of a conventional FPGA is difficult without impairing the overall function, may advantageously be carried out more easily.

In addition, the replacement of a few or unused functions or LRU functions (LRU stands for least recently used), which can be implemented only with difficulty in a cache mechanism with special external memory, separate from the FPGA, may be implemented significantly more easily.

The gate array according to the invention is also advantageous as compared with solutions proposed hitherto for solving the aforementioned problems and which can be summarized in the following points:

Large circuits or functions are partitioned and the functionality is distributed to a plurality of integrated circuits, or the circuits or functions are partitioned and the functionality is divided up over time, that is to say use is made of the possibility of reconfiguring the integrated circuits. The reconfiguration strategy and its time is defined by the user in advance.

Functions which run through automatic placement and routing tools are normally constructed very irregularly. A download strategy is not taken into account by the tools and can therefore be implemented with a great deal of effort.

The same applies to a download strategy.

A specific configuration connection which would be suitable to implement a caching mechanism, is normally not present. Some modules have serial connections, which are too slow, or the configuration connection needs the same resources as, for example, the data input.

Further advantages of the gate array according to the invention are to be seen in the fact that
- on a dynamically reconfigurable FPGA module, such as a module from the XC62xx series from XILINX®, by means of the buffer memory a caching memory can be implemented which is preferably and advantageously directly co-integrated.
- standard function modules (function macros) are already recognized during the compilation of a program and appropriately incorporated into the run-time program (binary), the macros which are no longer needed or which will be needed very soon with a high probability are already recognized during the compilation in the program graph produced, the macros are matched to the CLB structures, the geometry of the respective FPGA (as was the case, for example, in the case of the standard cells) and to the routine resources, because of their regular structure, macros can both be displaced laterally and duplicated, results are held in the registers of the FPGA and, following the downloading or the displacement of a function, can immediately continue to be used, one second dual-ported memory or else a plurality thereof is or are therefore connected to the SRAM (static memory with random access) of a CLB device (CLB stands for command line buffer) via a DMA device (DMA stands for direct memory access) likewise integrated on the chip, in such a way that function macros can be kept in reserve, and therefore a concealed reconfiguration can be carried out at any time, irrespective of the status of the program or of the currently used part of the CLB device, dynamic debugging can be carried out during the running of the program without the running of the program being impaired in any way, and registered values=variables can be distributed either point to point or repeatedly.

The invention advantageously permits the efficient use of "memory-organized" FPGAs for reconfigurable systems, for example in the area of custom computing.

Other features which are considered as characteristic for the invention are set forth in the appended claims.

Although the invention is illustrated and described herein as embodied in a reconfigurable gate array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
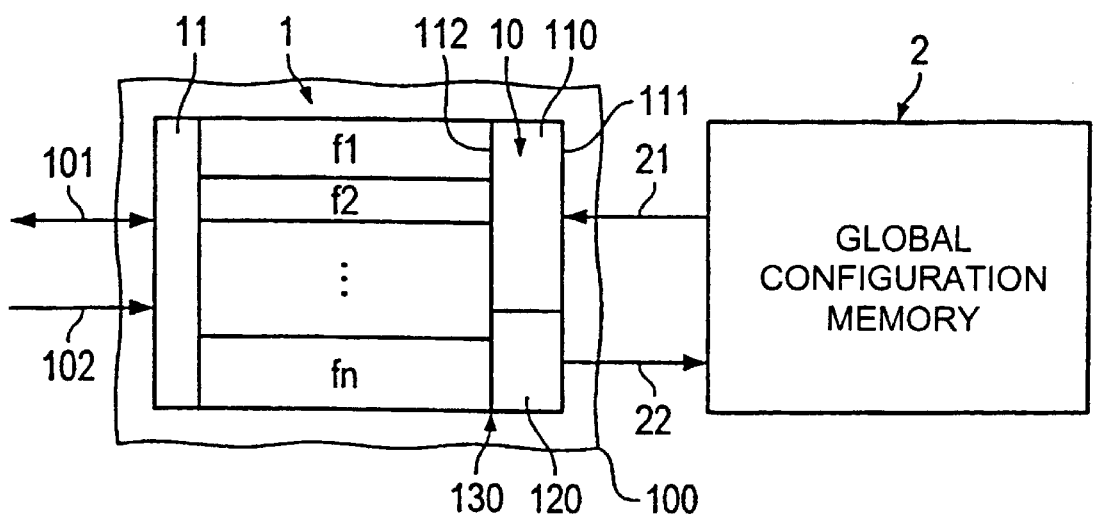
FIG. 1 is a schematic diagram of an exemplary embodiment of a gate array according to the invention.

Referring now to the figures of the drawing in detail and first, particularly, to FIG. 1 thereof, there is shown a reconfigurable gate array 1 with a number of function blocks f1, f2 ..., fn which are connected to one another by controllable wiring and can be controlled individually for the respective execution of a specific function, for example a function macro, and an interface 11 for data and address communication between a non-illustrated processor, preferably a microprocessor, and the gate array 1. A data line for transmitting data between the processor and the interface 11 is designated by 101, and an address line for transmitting addresses from the processor to the interface 11 is designated by 102. The interface 11 permits the gate array 1 to be addressed like a memory via address and data lines 102, 101. Via these lines 101, 102, both data interchange and reconfiguration are possible.

In addition, configurations, for example function macros, can be supplied to the gate array 1 from a configuration memory 2, each being used to control the function blocks f1, f2, ..., fn and/or their wiring. Configurations are transmitted from the configuration memory 2 to the gate array 1 via a line 21, and addresses are transmitted from the gate array 1 to the configuration memory 2 via a line 22.

The gate array 1 of FIG. 1, which in particular can be reconfigured dynamically, could in this form be, for example, an FPGA module of the XC62xx series from XILINX®.

According to the invention, in the gate array 1 of FIG. 1 there is a preferably fast buffer memory device 10 for the selectable storage of configurations from the configuration memory 2 and for direct selectable access from the gate array 1 to any configuration stored in the buffer memory device 2. The access from the gate array 1 to the buffer memory device 10 can be through a DMA device 130 co-integrated on the semiconductor chip or accommodated in an encapsulated form.

The buffer memory device 10 is preferably integrated together with the gate array 1 on a common semiconductor chip 100, of which only a fraction is illustrated in FIG. 1 and on which the configuration memory 2 can also be integrated.

The buffer memory device 10 is preferably configured with at least one dual-ported memory 110 with a (first) port 111 for the selectable supply of configurations from the configuration memory 2 and the storage of the configurations supplied in this memory 110, and with another (second) port 112, via which the gate array 1 has direct selectable access to any configuration stored in the memory 110. The memory 110 preferably has a RAM, in particular a static RAM or SRAM.

The buffer storage device 10 moreover preferably has a reconfiguration controller 120 for carrying out a buffer storage strategy.

By means of the buffer storage device 10, the gate array 1 is expanded by a caching mechanism, with which the problems mentioned at the beginning may be solved and by means of which one or more configurations, in particular function macros FM can be kept in reserve. A reconfiguration from the buffer memory device 10 is therefore possible in a concealed way at any time, irrespective of the status of a program or of the current utilization of the function or logic blocks f1, f2, ..., fn. The computing operation is not influenced as a result. Furthermore, dynamic debugging is possible during the running of the program. The function macros are configured in such a way that, because of their regular structure, they can both be displaced laterally and duplicated. Intermediate results of a computation can in this case be held in registers belonging to the gate array in order to use them further immediately following the downloading or displacement of a function.

Via the port 111 of the memory 110, further configurations or function macros can be loaded in order to fill up the memory 110. For the configuration of the gate array 1, it is possible to obtain a similar structure to that which is usual in memories, with on-chip cache (first level), second level cache, main memory and hard disc.

Since the buffer memory device 10 is limited in terms of size, after some time function macros have to be taken out of the buffer memory device 10 in order to create space for new function macros. Various strategies (caching strategies) can be used for this purpose.

One possible strategy for the reconfiguration for the configuration memory 2 is first to move out those function macros which were used last in chronological terms. If a function macro is moved out and is subsequently needed again, then it has to be loaded again (cache miss). This costs time for the configuration. In order to reduce the cache miss rate, each function macro is assigned a counter. Each time the function macro is used, a counter is decreased by 1. If the counter is loaded with the number of loop passes, then a function macro whose counter reading is less than 1 can be moved out without danger. In the case of data-dependent loops, the counter is set to a value from experience. The caching strategy is executed by the reconfiguration controller 120 in the case of the gate array 1.

The implementation of statements on the gate array 1 is done by projecting the execution tree of the statement onto the gate array 1.

A statement such as $$A=B+C*D+E*F$$

Figure 2:
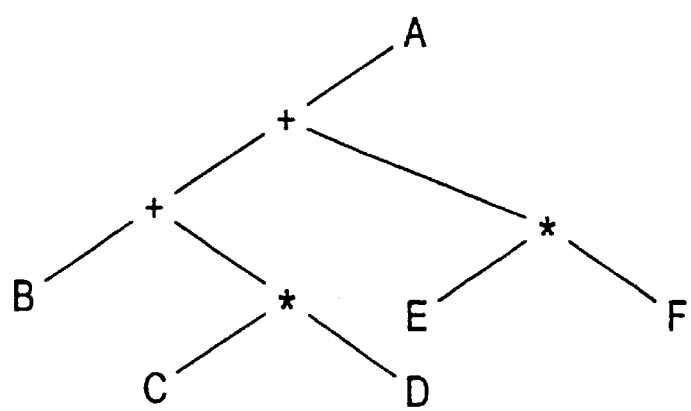
FIG. 2 is a diagram of an execution tree for exemplary statements.
Figure 3:
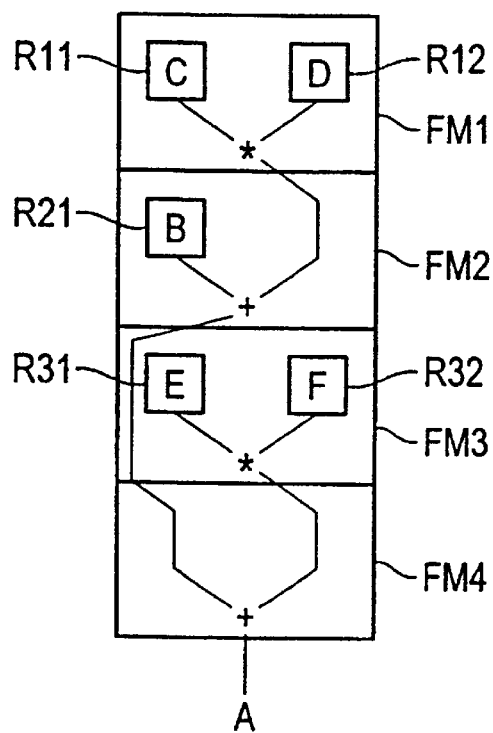
FIG. 3 is a schematic representation of an implementation of the statements corresponding to the execution tree on function macros of the gate array according to the invention.

(A, B, C, D, E and F are numerical values, + signifies addition, * signifies multiplication) and, in accordance with the execution tree represented in FIG. 2, is broken down into the four function macros FM1, FM2, FM3 and FM4 represented in FIG. 3.

The function macro FM1 comprises two registers R11 and R12, which can be loaded directly from outside via address and data lines. The content of the registers R11 and R12 is multiplied and the result is shifted into the function macro FM2. There, the register R21 is loaded with B and added to the result from the function macro FM1 shifted onwards. The new result is shifted into the function macro FM4. The function macro FM4 adds this result to the result from the function macro FM3, which comprises two registers R31 and R32, which can be loaded directly from outside via address and data lines and whose content is multiplied. The result from function macro FM4 constitutes the overall result A.

Figure 4:
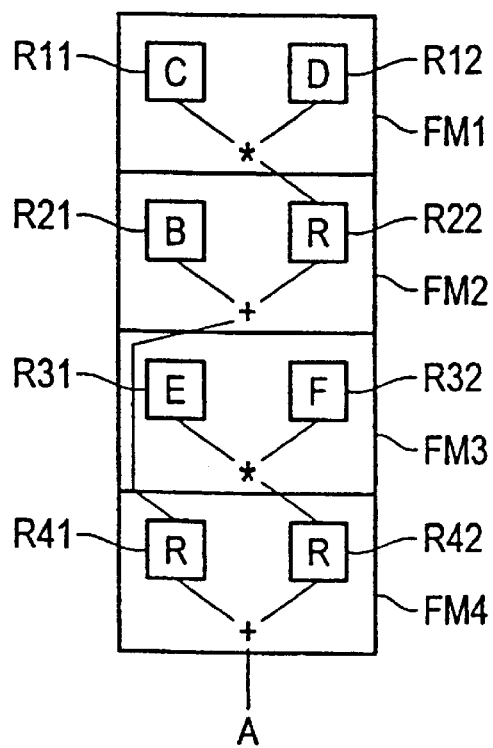
FIG. 4 is a schematic representation of the implementation of FIG. 3 in the presence of additional registers.

In order to make reconfiguration possible in this example, additional registers R22 and, R41 and R42, which store the intermediate results, can be introduced into the function macro FM2 and the function macro FM4, as illustrated in FIG. 4. Then, if the space occupied by the function macro FM1 in the gate array 1 is needed again, then the space can be released as soon as the function macro FM2 begins its calculation.

Figure 5:
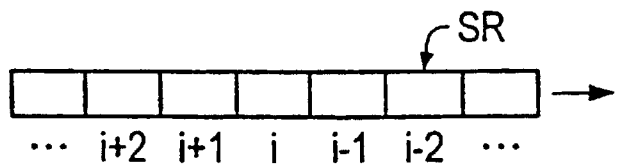
FIG. 5 is a schematic of a shift register for implementing a loop on the gate array according to the invention.

In the case of implementing a loop on the gate array 1, internal variables are reused by means of the shift register, which reduces the bottleneck to the data memory. Each variable used which depends on an index i is given a shift register SR, represented in FIG. 5. In the shift register SR, each position corresponds to an index i or an offset . . . i+2, i+1 or i−1, i−2, . . . in relation to the index i.

When the loop index i is increased by a constant k, which is generally equal to 1, the shift register SR is shifted onward by k places. In this way, the operations can be fixed at fixed points on the shift register SR. In order to represent the shift register SR with the operations as function macros, the shift register SR is distributed.

Figure 6:
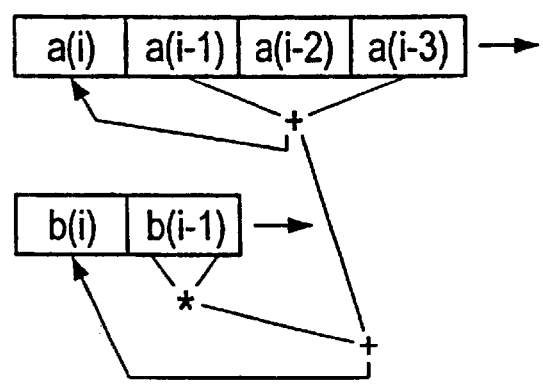
FIG. 6 is a schematic of a shift register structure for specific variables in a specific loop and the operations needed for this loop, with its linking to the shift register.
Figure 7:
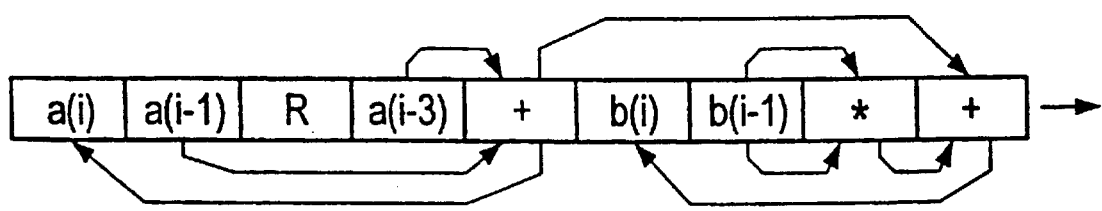
FIG. 7 is a schematic of the shift register structure of FIG. 6 as function macros, as can be implemented directly in the gate array according to the invention.

The procedure is illustrated in FIGS. 6 and 7 for the exemplary loop for (i=0; I<100, i++){
a(i)=a(i−1)+a(i−3);
b(i)=b(i−1)*b(i−1)+a(i);}.

FIG. 6 shows the shift register structure for the variable a, for the variable b and also the necessary operators + and *, with their linking to the shift register SR.

FIG. 7 shows the solution as function macros, as can be implemented directly in the gate array. After each calculation, the shift register SR is shifted onward by k=1, and the next calculation is carried out. The condition for detecting the end of the loop is either also implemented in the gate array 1 (increment index i and check to see whether less than 100) or implemented by an external control unit.

If the gate array 1 is to be managed dynamically, then it is expedient to have the gaps which are produced in the gate array 1 by the release of function macros in one piece as far as possible. This can be achieved by a garbage collect being implemented by shifting function macros. Such a garbage collect could run in the background, as a process in software of firmware with low priority, or could be implemented on the gate array 1 as specific hardware.

We claim:

1. A reconfigurable gate array assembly, comprising:

a gate array with a plurality of function blocks connected to one another via controllable wiring, said function blocks being individually controllable, for a respective execution of a specific function;

a first interface for data and address communication between said gate array and a processor;

a second interface for supplying configurations from a configuration memory, in each case needed to control one of said function blocks and said controllable wiring; and a buffer memory device connected to said second interface for selectively storing configurations from the configuration memory and for direct selective access from said gate array to any configuration stored in said buffer memory device;

said buffer memory device having a reconfiguration controller, operating in accordance with a caching strategy, for removing little-used, unused, or last-used configurations from said buffer memory device to create space for new configurations.

2. The gate array assembly according to claim 1, wherein said buffer storage device is commonly integrated with said gate array on a common semiconductor chip.

3. The gate array assembly according to claim 1, wherein said buffer storage device comprises at least one dual-ported memory having a first port for a selective supply of configurations from the configuration memory and for storing the configurations supplied in the double-ported memory, and a second port for allowing said gate array direct selective access to any configuration stored in said dual-ported memory.

* * * * *